(12) United States Patent
Stephens et al.

(10) Patent No.: US 10,563,298 B1
(45) Date of Patent: Feb. 18, 2020

(54) WAFER CHUCK WITH AERODYNAMIC DESIGN FOR TURBULENCE REDUCTION

(71) Applicant: Novellus Systems, Inc., Fremont, CA (US)

(72) Inventors: Craig P. Stephens, Lake Oswego, OR (US); Matt Kanetomi, Tigard, OR (US); Joseph Richardson, Sherwood, OR (US); Chris Veazey, Tualatin, OR (US); Aaron LaBrie, Oregon City, OR (US)

(73) Assignee: Novellus Systems, Inc., Fremont, CA (US)

( * ) Notice: Subject to any disclaimer, the term of this patent is extended or adjusted under 35 U.S.C. 154(b) by 241 days.

(21) Appl. No.: 15/647,183

(22) Filed: Jul. 11, 2017

Related U.S. Application Data

(62) Division of application No. 11/737,045, filed on Apr. 18, 2007, now Pat. No. 9,732,416.

(51) Int. Cl.
| | | |
|---|---|---|
| *H01L 21/683* | (2006.01) | |
| *H01L 21/687* | (2006.01) | |
| *C23C 14/50* | (2006.01) | |
| *C23C 16/458* | (2006.01) | |

(52) U.S. Cl.
CPC ........ *C23C 14/505* (2013.01); *C23C 16/4584* (2013.01); *C23C 16/4588* (2013.01); *H01L 21/68764* (2013.01)

(58) Field of Classification Search
None
See application file for complete search history.

(56) References Cited

U.S. PATENT DOCUMENTS

| | | |
|---|---|---|
| 4,313,266 A | 2/1982 | Tam |
| 4,788,994 A | 12/1988 | Shinbara |
| 4,968,375 A | 11/1990 | Sato et al. |
| 5,009,738 A | 4/1991 | Gruenwald et al. |
| 5,376,216 A | 12/1994 | Yoshioka et al. |
| 5,384,008 A | 1/1995 | Sinha et al. |
| 5,486,234 A | 1/1996 | Contolini et al. |
| 5,532,190 A | 7/1996 | Goodyear et al. |

(Continued)

FOREIGN PATENT DOCUMENTS

| | | |
|---|---|---|
| DE | 4109955 | 10/1992 |
| JP | 04-135110 | 5/1992 |

(Continued)

OTHER PUBLICATIONS

U.S. Office Action, dated Mar. 30, 2001, issued in U.S. Appl. No. 09/557,668.

(Continued)

*Primary Examiner* — Sylvia MacArthur
(74) *Attorney, Agent, or Firm* — Weaver Austin Villeneuve & Sa,pson LLP

(57) ABSTRACT

A rotatable wafer chuck includes chuck arms and wafer holders that are aerodynamically shaped to reduce turbulence during rotation. A wafer holder may include a friction support and an independently rotatable vertical alignment member and clamping member that is shaped to reduce drag. The shape reduces turbulence during edge bevel etching to improve the uniformity of the edge exclusion and during high-speed rotation to improve particle performance.

15 Claims, 12 Drawing Sheets

(56) References Cited

U.S. PATENT DOCUMENTS

| | | | |
|---|---|---|---|
| 5,674,410 A | 10/1997 | Nakajima et al. | |
| 5,798,016 A | 8/1998 | Oehrlein et al. | |
| 5,810,940 A | 9/1998 | Fukazawa et al. | |
| 5,882,433 A | 3/1999 | Ueno | |
| 5,897,379 A | 4/1999 | Ulrich et al. | |
| 5,954,072 A | 9/1999 | Matusita | |
| 5,989,342 A | 11/1999 | Ikeda et al. | |
| 6,046,097 A | 4/2000 | Hsieh et al. | |
| 6,050,506 A | 4/2000 | Guo et al. | |
| 6,051,501 A | 4/2000 | Becker et al. | |
| 6,114,254 A | 9/2000 | Rolfson | |
| 6,162,739 A | 12/2000 | Sumnitsch et al. | |
| 6,167,893 B1 | 1/2001 | Taatjes et al. | |
| 6,217,034 B1 | 4/2001 | Smedt et al. | |
| 6,267,853 B1 | 7/2001 | Dordi | |
| 6,273,484 B1 | 8/2001 | Peng | |
| 6,297,155 B1 | 10/2001 | Simpson et al. | |
| 6,306,245 B1 | 10/2001 | Yanagisawa et al. | |
| 6,309,981 B1 | 10/2001 | Mayer et al. | |
| 6,333,275 B1 | 12/2001 | Mayer et al. | |
| 6,363,623 B1 | 4/2002 | Abraham | |
| 6,413,436 B1 | 7/2002 | Aegerter et al. | |
| 6,506,689 B2 | 1/2003 | Rolfson | |
| 6,516,815 B1 * | 2/2003 | Stevens | H01L 21/6708 134/147 |
| 6,520,839 B1 | 2/2003 | Gonzalez-Martin et al. | |
| 6,537,416 B1 * | 3/2003 | Mayer | H01L 21/67051 118/729 |
| 6,578,853 B1 | 6/2003 | Treur et al. | |
| 6,586,342 B1 | 7/2003 | Mayer et al. | |
| 6,589,878 B1 | 7/2003 | Lorimer | |
| 6,758,908 B2 | 7/2004 | Whitman | |
| 6,817,640 B2 | 11/2004 | Menon et al. | |
| 6,838,355 B1 | 1/2005 | Stamper et al. | |
| 6,967,174 B1 | 11/2005 | Mayer et al. | |
| 7,029,567 B2 | 4/2006 | Basol | |
| 7,284,760 B2 | 10/2007 | Siebert et al. | |
| 7,399,713 B2 | 7/2008 | Aegerter et al. | |
| 7,780,867 B1 | 8/2010 | Mayer et al. | |
| 7,959,139 B2 | 6/2011 | Fukui et al. | |
| 8,100,081 B1 | 1/2012 | Henri et al. | |
| 8,172,646 B2 | 5/2012 | Feng et al. | |
| 8,419,964 B2 | 4/2013 | Ganesan et al. | |
| 9,685,353 B2 | 6/2017 | Ganesan et al. | |
| 9,732,416 B1 * | 8/2017 | Stephens | C23C 16/4588 |
| 2002/0160701 A1 | 10/2002 | Fehr et al. | |
| 2002/0179247 A1 | 12/2002 | Davis et al. | |
| 2003/0131494 A1 | 7/2003 | Lubomirsky et al. | |
| 2003/0196683 A1 | 10/2003 | Izumi et al. | |
| 2004/0023475 A1 | 2/2004 | Bonser et al. | |
| 2004/0023502 A1 | 2/2004 | Tzou et al. | |
| 2004/0065540 A1 | 4/2004 | Mayer et al. | |
| 2004/0137745 A1 | 7/2004 | Houghton et al. | |
| 2004/0157471 A1 | 8/2004 | Davlin et al. | |
| 2005/0127361 A1 | 6/2005 | Hatano et al. | |
| 2006/0291854 A1 | 12/2006 | Kaneyama et al. | |
| 2007/0068900 A1 | 3/2007 | Kim et al. | |
| 2007/0071439 A1 | 3/2007 | Kaneyama et al. | |
| 2007/0224826 A1 | 9/2007 | Delgadino et al. | |
| 2007/0232072 A1 | 10/2007 | Zheng et al. | |
| 2007/0273108 A1 | 11/2007 | Kitatsuru et al. | |
| 2010/0055924 A1 | 3/2010 | Ganesan et al. | |
| 2010/0219920 A1 | 9/2010 | Feng et al. | |
| 2014/0190529 A1 | 7/2014 | Ganesan et al. | |

FOREIGN PATENT DOCUMENTS

| | | |
|---|---|---|
| JP | 04-186626 | 7/1992 |
| JP | 05-013322 | 1/1993 |
| JP | 05-326483 | 12/1993 |
| JP | 06-045302 | 2/1994 |
| JP | 09-171989 | 6/1997 |
| JP | 10-059540 | 3/1998 |
| JP | 2007-220868 A | 8/2007 |
| KR | 10-0131737 B1 | 4/1998 |
| KR | 10-2008-0080815 | 9/2005 |
| WO | WO 99/46064 | 9/1999 |

OTHER PUBLICATIONS

U.S. Office Action, dated Jun. 19, 2002, issued in U.S. Appl. No. 09/558,249.
U.S. Office Action, dated Dec. 16, 2004, issued in U.S. Appl. No. 10/357,999.
U.S. Notice of Allowance, dated May 24, 2005, issued in U.S. Appl. No. 10/357,999.
U.S. Office Action, dated Jul. 6, 2006, issued in U.S. Appl. No. 11/248,874.
U.S. Office Action, dated Aug. 23, 2007, issued in U.S. Appl. No. 11/248,874.
U.S. Office Action, dated Nov. 28, 2007, issued in U.S. Appl. No. 11/248,874.
U.S. Office Action, dated Jun. 4, 2008, issued in U.S. Appl. No. 11/248,874.
U.S. Final Office Action, dated Nov. 30, 2009, issued in U.S. Appl. No. 11/248,874.
U.S. Notice of Allowance, dated Jun. 4, 2010, issued in U.S. Appl. No. 11/248,874.
U.S. Office Action, dated Aug. 27, 2001, issued in U.S. Appl. No. 09/557,695.
U.S. Office Action, dated May 6, 2009, issued in U.S. Appl. No. 11/515,346.
U.S. Final Office Action, dated Nov. 12, 2009, issued in U.S. Appl. No. 11/515,346.
U.S. Final Office Action, dated Mar. 31, 2010, issued in U.S. Appl. No. 11/515,346.
U.S. Office Action, dated Oct. 19, 2010, issued in U.S. Appl. No. 11/515,346.
U.S. Final Office Action, dated Apr. 28, 2011, issued in U.S. Appl. No. 11/515,346.
U.S. Notice of Allowance, dated Sep. 21, 2011, issued in U.S. Appl. No. 11/515,346.
U.S. Office Action, dated May 17, 2012, issued in U.S. Appl. No. 12/199,412.
U.S. Notice of Allowance, dated Dec. 13, 2012, issued in U.S. Appl. No. 12/199,412.
U.S. Office Action, dated Feb. 12, 2016, issued in U.S. Appl. No. 13/857,883.
U.S. Final Office Action, dated Sep. 20, 2016, issued in U.S. Appl. No. 13/857,883.
U.S. Notice of Allowance, dated Feb. 22, 2017, issued in U.S. Appl. No. 13/857,883.
U.S. Office Action, dated Sep. 29, 2011, issued in U.S. Appl. No. 12/394,339.
U.S. Notice of Allowance, dated Jan. 31, 2012, issued in U.S. Appl. No. 12/394,339.
Korean Office Action, dated Mar. 8, 2016, issued in Application No. KR 10-2010-0018330.
Bird, R. Bryan et al., (1960) "Chapter 6: Interphase transport isothermal systems," *John Wiley and Sons,* pp. 180-1993.
Glen Research Center, "Shape Effects on Drag", *National Aeronautics and Space Administration* website: [http://www.grc.nasa.gov/WWW/K/airplane/shaped.html, downloaded Apr. 18, 2007].
Wolf, Stanley et al., "Silicon Processing for the VLSI Era, vol. 1: Process Technology", Lattice Press 91986, pp. 516-520.
U.S. Appl. No. 12/834,788, filed Jul. 12, 2010, Mayer et al.
U.S. Appl. No. 11/479,353, filed Jun. 30, 2006, Mountsier et al.
U.S. Appl. No. 12/701,387, filed Feb. 5, 2010, Mountsier et al.
U.S. Appl. No. 11/737,045, filed Apr. 18, 2007, Stephens et al.
U.S. Office Action, dated Jul. 20, 2012, issued in U.S. Appl. No. 12/834,788.
U.S. Final Office Action, dated Feb. 4, 2013, issued in U.S. Appl. No. 12/834,788.
U.S. Office Action, dated Dec. 2, 2008, issued in U.S. Appl. No. 11/479,353.

(56) References Cited

OTHER PUBLICATIONS

U.S. Office Action, dated Jun. 1, 2009, issued in U.S. Appl. No. 11/479,353.
U.S. Office Action, dated Dec. 7, 2009, issued in U.S. Appl. No. 11/479,353.
U.S. Office Action, dated Sep. 15, 2011, issued in U.S. Appl. No. 12/701,387.
U.S. Final Office Action, dated Feb. 23, 2012, issued in U.S. Appl. No. 12/701,387.
U.S. Office Action, dated Jun. 24, 2010, issued in U.S. Appl. No. 11/737,045.
U.S. Final Office Action, dated Dec. 9, 2010, issued in U.S. Appl. No. 11/737,045.
U.S. Office Action, dated Feb. 28, 2014, issued in U.S. Appl. No. 11/737,045.
U.S. Final Office Action, dated Jun. 4, 2014, issued in U.S. Appl. No. 11/737,045.
U.S. Office Action, dated Nov. 6, 2014, issued in U.S. Appl. No. 11/737,045.
U.S. Final Office Action, dated Feb. 17, 2015, issued in U.S. Appl. No. 11/737,045.
U.S. Examiner's Answer to Appeal Brief dated Nov. 4, 2015 issued in U.S. Appl. No. 11/737,045.
U.S. Patent Board Decision on Appeal-Examiner Reversed dated Mar. 13, 2017 issued in U.S. Appl. No. 11/737,045.
U.S. Notice of Allowance, dated Apr. 11, 2017, issued in U.S. Appl. No. 11/737,045.

\* cited by examiner

TOP VIEW

SIDE VIEW

BOTTOM VIEW

| Shape | $C_d$ |
|---|---|
| 701 — (hollow hemisphere, open side to wind) | 0.38 |
| 703 — (hemisphere, curved side to wind) | 0.42 |
| 705 — (oval) | 0.59 |
| 707 — (square/diamond) | 0.8 |
| 709 — (cone, 60°) | 0.5 |

WAFER CHUCK WITH AERODYNAMIC DESIGN FOR TURBULENCE REDUCTION

CROSS-REFERENCE TO RELATED APPLICATION

This application is a division of U.S. patent application Ser. No. 11/737,045, filed on Apr. 18, 2007, and titled "WAFER CHUCK WITH AERODYNAMIC DESIGN FOR TURBULENCE REDUCTION," which is incorporated by reference herein in its entirety and for all purposes.

FIELD OF THE INVENTION

The present invention relates generally to methods and apparatus for semiconductor processing and more particularly to a wafer chuck and methods for rotating the wafer in a chuck. It is particularly useful for post copper electroplating processing in damascene and dual damascene integrated circuit fabrication methods.

BACKGROUND OF THE INVENTION

This invention relates to technology for rotating a semiconductor wafer during post copper electroplating processing in a post electrofill module (PEM). More particularly, the invention pertains to wafer chucks used in PEMs to align, rotate and clamp the semiconductor wafer. The modules typically perform a metal etch removing the edge bevel copper, rinse the wafer, and dry the wafer. The PEMs are typically a part of an integrated electrofill modules that includes metal deposition, etching, and any other pre and post treatment.

During integrated circuit fabrication, conductive metal is needed on the active circuit region of the wafer, i.e., the main interior region on the front side, but is undesirable elsewhere. In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer.

As a byproduct of this process step, PVD metal typically coats the front edge area outside the active circuit region, as well as the side edge, and to some degree, the backside. Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. Pat. No. 6,156,167, "Clamshell Apparatus For Electrochemically Treating Semiconductor Wafers," issued to E. Patton et al. on Dec. 5, 2000, which is herein incorporated by reference in its entirety for all purposes.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick, even electrofill metal and planarized by CMP down to the dielectric. This flat surface, which is mostly dielectric, is then covered with a barrier layer substance such as SiN that both adheres well to the dielectric and aids in the adhesion of subsequent layers.

Wafer chucks have been designed that can hold the semiconductor wafer during the metal etch. The system may align the wafer on chuck for rotation. Conventionally, such alignment is done by placing the wafer on the chuck that has a self-aligning capability or in a separate alignment module and then transporting it the chuck. The wafer chuck does not contact the wafer edges during the actual etching of unwanted metal from those regions. Otherwise, the viscous etchant would not be able to flow over the side edge of the wafer unimpeded. During rinsing and drying, the wafer may rotate at high-speeds, at which time the wafer is preferably constrained to the wafer chuck. Such a wafer chuck is described in U.S. Pat. No. 6,537,416 issued to Mayer et al. on Mar. 25, 2003, U.S. Pat. No. 6,967,174 issued to Mayer et al. on Nov. 22, 2005, both titled "Wafer Chuck For Use In Edge Bevel Removal of Copper From Silicon Wafers" and are incorporated by reference herein in its entirely for all purposes. The wafer chuck is also described in U.S. patent application Ser. No. 11/248,874, filed Oct. 11, 2005, titled "Edge Bevel Removal of Copper From Silicon Wafers," which is incorporated by reference herein in its entirely for all purposes.

However, some problems have been observed with the process using the wafer chuck. The edge exclusion (EE), the portion of the wafer etched during EBR, has been observed to vary at different locations of the wafer. Irregularity of the etchant stream may cause this variation. At times, this EE variation manifests as a wave in the copper around the edge, caused by incomplete removal in some areas. Another problem is particles transfer to the wafer by the mechanical action of the tool. Tool availability may be reduced by adders such as particles, droplets, streaks, or any other contamination that can be entrained and transported to the wafer surface because the test is re-run until the cleanliness reduces to some prescribed level.

Therefore, an improved wafer chuck design is desirable.

SUMMARY OF THE INVENTION

The present invention provides wafer chucks designed to solve the above-described problems, among others. An improved rotatable wafer chuck includes chuck arms and wafer holders that are aerodynamically shaped to reduce turbulence during rotation. A wafer holder may include a friction support and an independently rotatable vertical alignment member and clamping member that is shaped to reduce drag. The shape reduces turbulence during edge bevel etching to improve the uniformity of the edge exclusion and during high-speed rotation to improve particle performance.

While the wafer chuck is described in the context of post electrofill modules, similar designs may be employed with other types of semiconductor processing modules. It will be apparent to those of ordinary skill in the art that various specifications, alignment and clamping timings/rotational speeds can be modified to adapt the wafer chuck of the present invention to other semiconductor wafer processes.

One aspect of the invention provides for a wafer chuck with a number of chuck arms extending radially outwards from the center of the chuck. Each chuck arm ends in a wafer holder, and each wafer holder has a front end and a back end along the direction of the rotation of the chuck. Either end or both may be a turbulence reducing structure having a aerodynamic shape. The wafer holder may include an alignment member and a clamping member. The aerodynamically shaped portion may be the clamping member.

The aerodynamic shape may have sharp or rounded edges. The shape may be, for example, an elliptic paraboloid or a cone, with a portion or a quadrant removed, creating a shelf. A wafer on the chuck would occupy the shelf, with some clearance outward and below the wafer. The shape may also be a prismatoid having three or more sides, with also a portion or a quadrant removed. A prismatoid is a polyhedron where all the vertices lie in one of two parallel planes. For example, a pyramid has one vertex in one plane and 3 or more vertices in another plane. A wedge is also a prismatoid having two vertices in one plane and four in another. The shape may further include one or more curved lines and one or more curved sides.

The wafer sits on friction supports on the chuck arms. When the chuck is at low rotational speed (below edge bevel reduction (EBR) speed) or at rest, the alignment members are in an inward, alignment position. At the inward position, the alignment pins make a slightly over sized pocket (for 300 mm wafers, just 0.06 mm larger) and may or may not contact the wafer edge. Above a certain rotational speed, the alignment members move away from the edge of the wafer, thus allowing the EBR etchant to flow over the edge of the wafer unimpeded. At these speeds, the clamping members are in an outward, non-clamping position. At still higher rotational speeds (e.g., drying speeds), the clamping members move inward to clamp the wafer by contacting its edge. The invention provides for alignment and clamping members that are independently rotatable in a perpendicular direction to the wafer surface. The members may be cams and be designed so that they will automatically move inward or outward about pivot pins, based on the direction of the centripetal force on the cams.

The turbulence reducing structure having an aerodynamic shape preferably substantially shields the alignment member from direct airflow while the chuck is rotating. Using a low drag shape reduces the air turbulence created by the high-speed rotation of the chuck. The drag coefficient may be about 0.5 or less, preferably about 0.2 to 0.3. The overall angle of the turbulence reducing structure may be about 30-90 degrees, preferably 30-60 degrees. The overall angle is the apex angle of a triangle containing the turbulence reducing structure with the apex pointing in the forward direction of rotation and the base perpendicular to the wafer. In other words, this overall angle would affect the drag coefficient and length of the turbulence reducing structure—smaller angle, longer structure with lower drag; bigger angle, shorter structure with bigger drag. In certain embodiments, the total length of the structures may overlap less than about 25% of the wafer perimeter, preferably less than about 10% of the wafer perimeter.

Another aspect of the invention provides for a method of processing a semiconductor wafer in a wafer chuck by providing a wafer to the wafer chuck and rotating the chuck thereby rotating the wafer. The wafer chuck has a number of arms and wafer holders at the ends of the arms. The wafer holder may include a turbulence reducing forward end, a turbulence reducing rear end, or turbulence reducing forward and rear ends. The method may further include etching metal from the wafer, cleaning the wafer, and drying the wafer while it rotates. The method may also include aligning the wafer and clamping the wafer while it rotates at a high speed during the drying step.

These and other features and advantages of the present invention will be described in more detail below with reference to the associated drawings.

BRIEF DESCRIPTION OF THE DRAWINGS

FIG. 7 is a graphic table showing drag coefficients for different shaped objects.

DETAILED DESCRIPTION OF A PREFERRED EMBODIMENT

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

INTRODUCTION

Figure 1A:
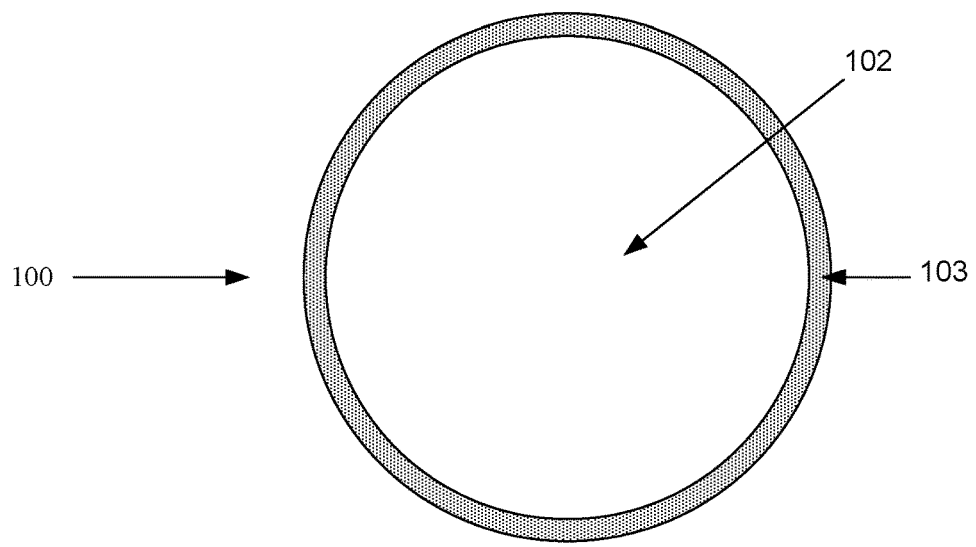
FIG. 1A-1C are illustrations of the top, side, and bottom views, respectively, of a semiconductor wafer showing the location of the edge bevel region that is etched in accordance with this invention.
Figure 1B:
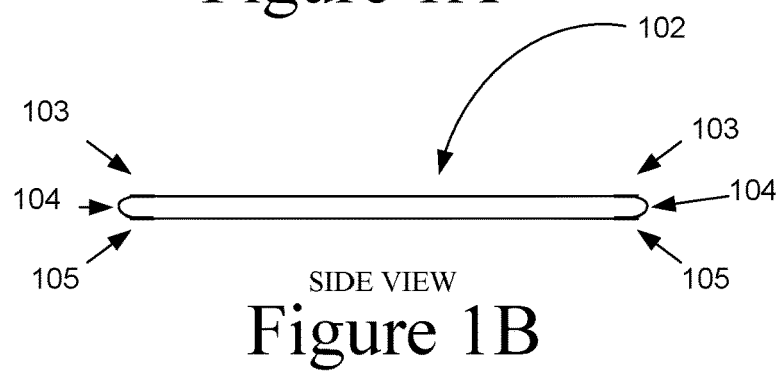
Figure 1C:
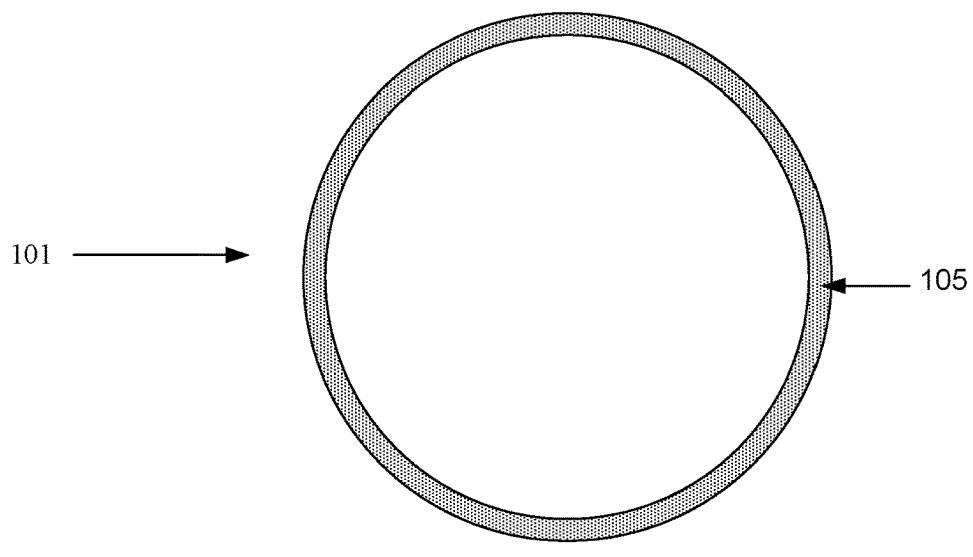

As indicated, aspects of this invention pertain a wafer chuck design that improves uniformity of edge exclusion etched during EBR and particle performance. To facilitate understanding the concepts of this invention, a schematic illustration of a semiconductor wafer is shown in FIGS. 1A-1C. As shown in FIG. 1A, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the useable active surface region extends to within at least 1.5 and 4 mm of the outer boundary of the wafer. With a 300 mm wafer, the useable region may extend to within about 1.3 and 3.75 mm of the outer boundary of the wafer. In some cases, the useable region may be within about 1.75 and 2 of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge 104 as depicted in FIG. 1B lies in the area between the front side 100 and the backside 101, and the back edge 105 is roughly the area near the outer boundary of the wafer on its backside, approximately analogous to the front edge area.

A "post-electrofill module" (PEM) or "EBR module" as referred to in this invention is a module that is specifically designed to carry out the edge bevel removal (EBR) process, backside etch (BSE) process and ancillary processes including pre-rinsing, rinsing, acid washing and drying. An integrated-electrofill module as referred to in this invention is a module that carries out electrofill.

Figure 2:
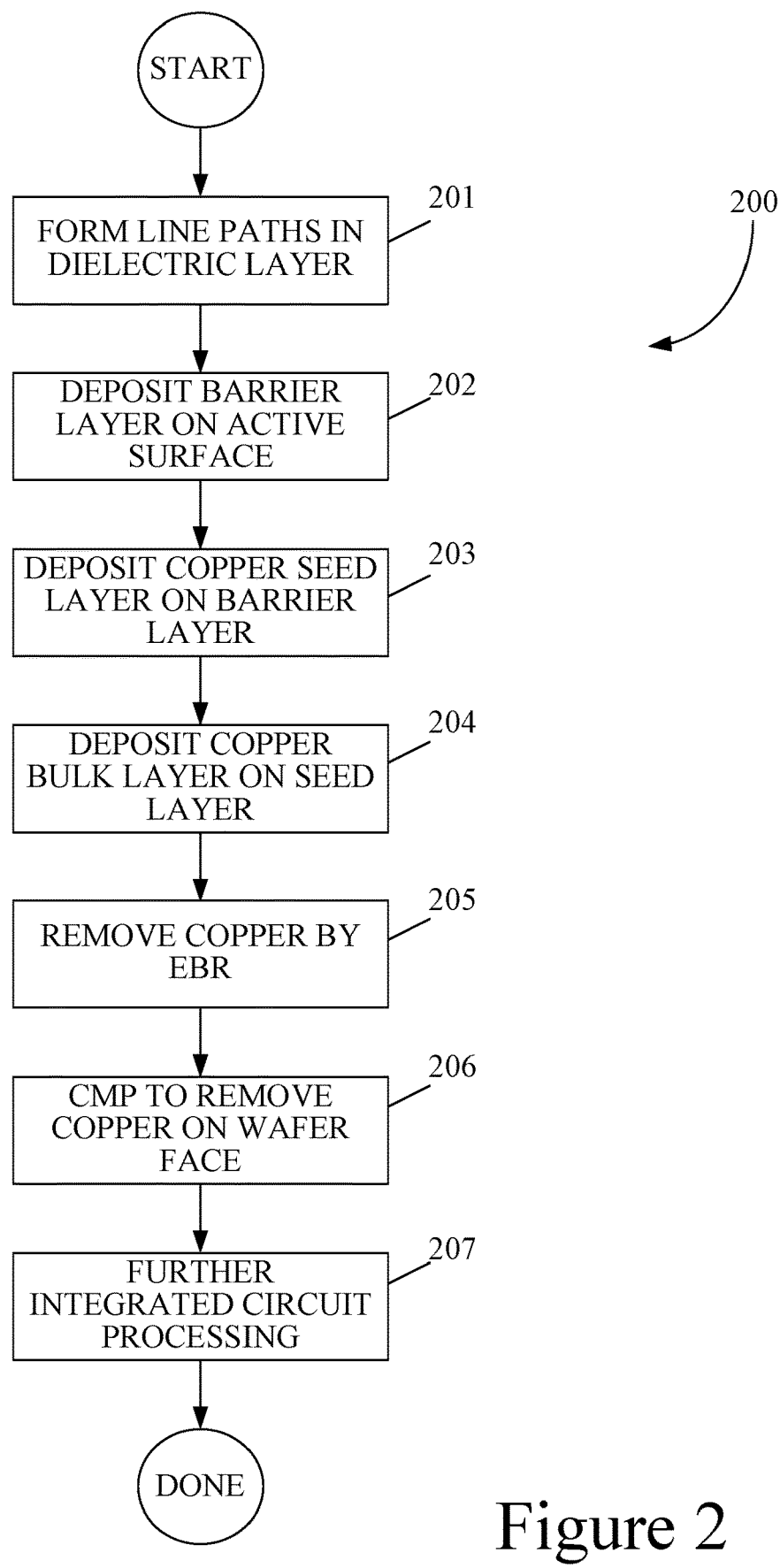
FIG. 2 is a process flow diagram illustrating relevant operations employed to form conductive copper lines a Damascene process in the context of this invention.

While details of certain embodiments may be found below in this application, a short description of a typical Damascene process will now be provided to facilitate understanding the context of the present invention as shown in FIG. 2. The process begins with formation of line paths 201 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 202 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. However, before electrofilling, a conductive surface coating must be applied. In the depicted process, this is accomplished by depositing a copper seed layer on the barrier layer at 203. A PVD process such as sputtering may be employed to this end. A thicker layer of bulk copper is then deposited over the seed layer 204, typically by electroplating using an electroplating solution. The copper is deposited to a thickness that completely fills the various line paths in the dielectric layer.

During the deposition of PVD copper in some unwanted areas cannot be avoided. This copper must be removed, and this is accomplished by the edge bevel removal (EBR) and/or backside etch (BSE) processes. With EBR at 205, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer and removing wanted copper from the active circuit region. It is important for the stream of etchant to apply evenly, otherwise variations in edge exclusion would result. An uniform edge exclusion creates the maximum active and useable surface area. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. After EBR, the electroplated copper is planarized, generally by chemical-mechanical polishing (CMP) down to the dielectric at 206 in preparation for further processing (207), generally the addition of subsequent dielectric and metallization layers.

Figure 3:
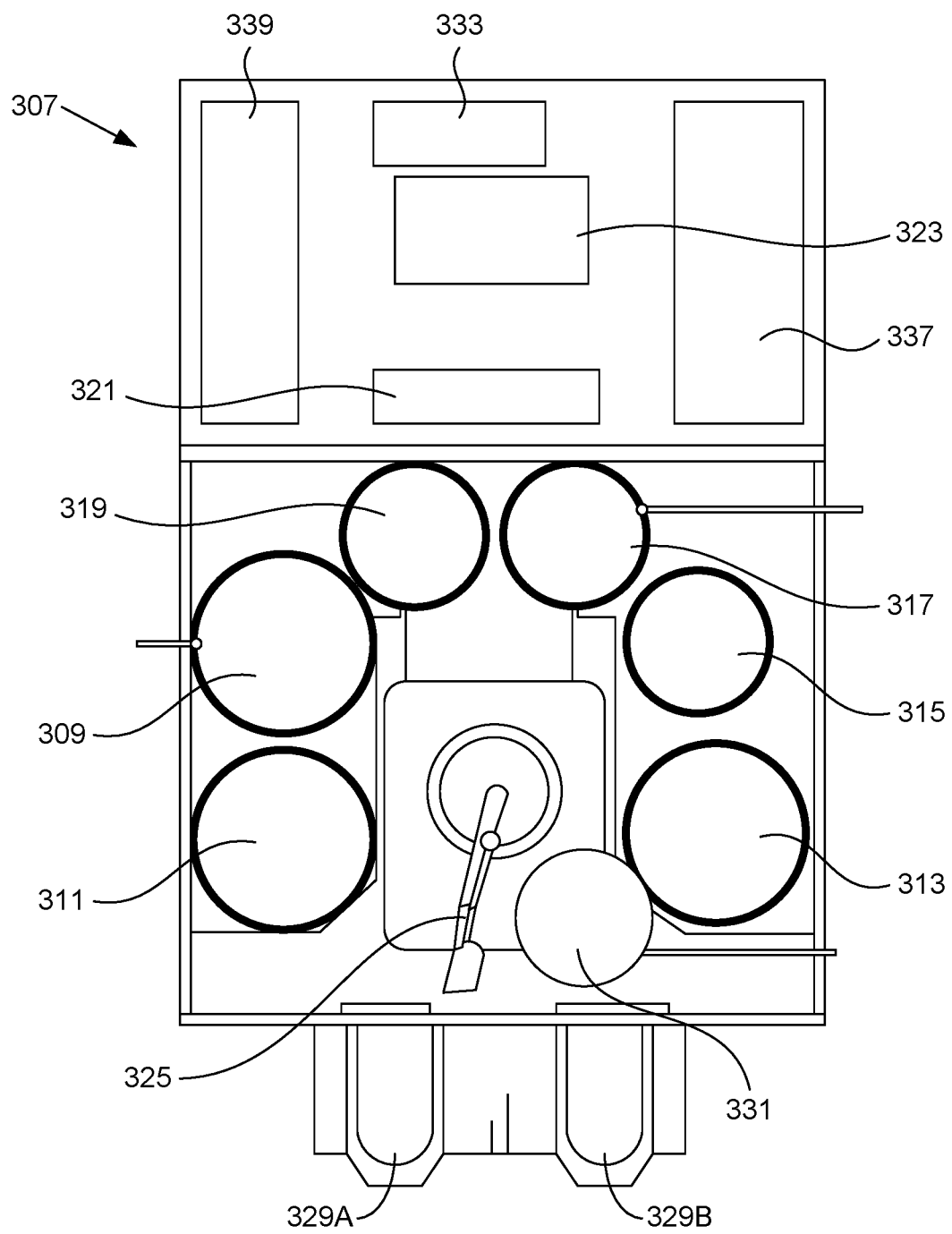
FIG. 3 is a block diagram illustrating a group of modules used to form copper conductive lines on an integrated circuit.

FIG. 3 depicts an electrofill system 307 in which the invention may reside. The specific system includes three separate electrofill modules 309, 311 and 313. System 307 also includes three separate post electrofill modules (PEMs) 315, 317 and 319. Each of these may be employed to perform each of the following functions: edge bevel removal, backside etching, and acid cleaning of wafers after they have been electrofilled by one of modules 309, 311, and 313. System 307 also includes a chemical dilution module 321 and a central electrofill bath 323. This is a tank that holds the chemical solution used as the electroplating bath in the electrofill modules. System 307 also includes a dosing system 333 that stores and delivers chemical additives for the plating bath. A chemical dilution module 321 stores and mixes chemicals to be used as the etchant in the post electrofill modules. A filtration and pumping unit 337 filters the plating solution for central bath 323 and pumps it to the electrofill modules. Finally, an electronics unit 339 provides the electronic and interface controls required to operate system 307. Unit 339 may also provide a power supply for the system.

In operation, a robot including a robot arm 325 selects wafers from a wafer cassette such as a cassette 329A or a cassette 329B. Robot arm 325 may attach to the wafer using a vacuum attachment or some other attaching mechanism.

To ensure that the wafer is properly aligned on robot arm 325 for precision delivery to an electrofill module, robot arm 325 transports the wafer to an aligner 331. In certain embodiments, aligner 331 includes alignment arms against which robot arm 325 pushes the wafer. When the wafer is properly aligned against the alignment arms, the robot arm 325 moves to a preset position with respect to the alignment arms. In other embodiments, the aligner 331 determines the wafer center so that the robot arm 325 picks up the wafer from the new position. It then reattaches to the wafer and delivers it to one of the electrofill modules such as electrofill module 309. There, the wafer is electrofilled with copper metal. Electrofill module 309 employs electrolyte from a central bath 323.

After the electrofill operation completes, robot arm 325 removes the wafer from electrofill module 309 and transports it to one of the post-electrofill modules such as module 317. There unwanted copper from certain locations on the wafer (namely the edge bevel region and the backside) is etched away by an etchant solution provided by chemical dilution module 321. The wafer is also cleaned, rinsed, and dried.

Preferably the wafer is precisely aligned within post electrofill module 317 without making use of aligner 331. To this end, the post electrofill modules may be provided with an wafer chuck capable of aligning the wafer. In an alternative embodiment, the wafer is separately aligned within aligner 331 after electrofill and prior to edge bevel removal in module 317.

After processing in post electrofill module 317 is complete, robot arm 325 retrieves the wafer from the module and returns it to cassette 329A. From there the cassettes can be provided to other systems such as a chemical mechanical polishing system for further processing.

The Post Electrofill Module (PEM) and Process

Figure 4:
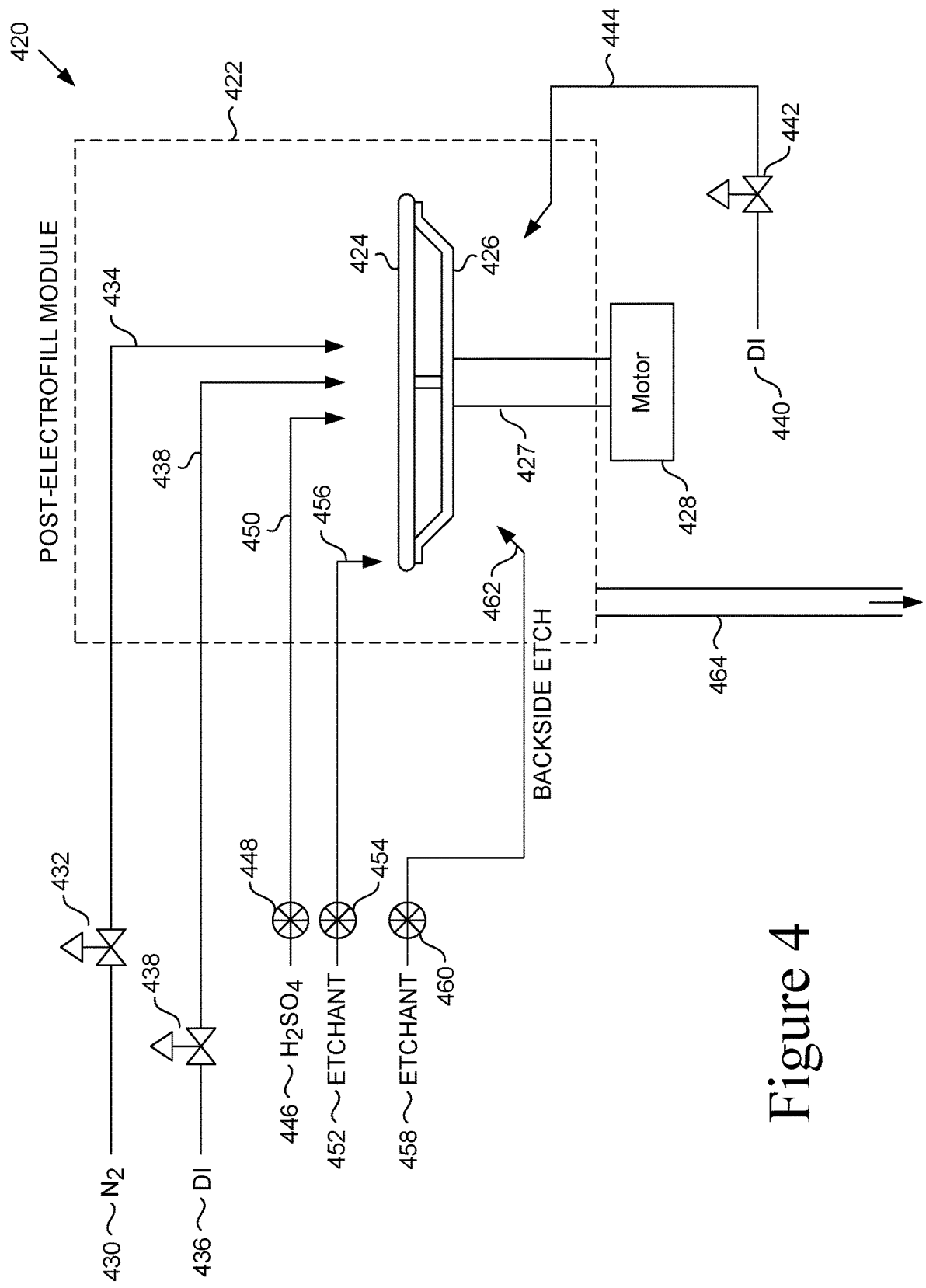
FIG. 4 is a block diagram illustrating various elements of a post-electrofill module in accordance with one embodiment of this invention.

FIG. 4 schematically illustrates an embodiment of a post-electrofill module 420 suitable for use with this invention. As shown, module 420 includes a chamber 422 in which a semiconductor wafer 424 rotates. Wafer 424 resides on a wafer chuck 426 which imparts rotational motion to wafer 424. Chamber 422 is outfitted with a drain and associated drain line 464. The drain allows the various liquid streams provided to chamber 422 to be removed for waste treatment.

A motor 428 controls the rotation of chuck 426. Motor 428 should be easy to control and should smoothly transition between various rotational speeds. It may reside within or without chamber 422. In some embodiments, to protect against damage from liquid etchant, motor 428 resides outside of chamber 422 and is separated therefrom by a seal through which a rotating shaft 427 passes. Preferably, motor 428 can rapidly accelerate and decelerate (in a controlled fashion) chuck 426 and wafer 425 at rotation rates between 0 and about 2000 rpm. The motor speed and other operations should be controllable by a computer.

Chuck 426 may be of a design that holds wafer 424 in position during various rotational speeds. It may also facilitate alignment of wafer 424 for the etching process. Chamber 422 may be of any suitable design that confines the liquid etchant within its interior and allows delivery of the various fluids to wafer 424. It should be constructed of an etchant resistant material and include ports and nozzles for the various liquid and gaseous streams used during etching and cleaning.

Gaseous nitrogen or other non-reactive gas may be provided to post electrofill module 420 from a gas source 430. Nitrogen from source 430 is delivered to chamber 422 under the control of a valve 432. The gaseous nitrogen is delivered into chamber 422 via a line and nozzle 434 positioned to deliver the nitrogen in a downward approximately laminar flow. As the wafer 424 spins on the wafer chuck 426, a turbulence extending to the wall of the chamber can entrain droplets of solution. The vortex may be suppressed by this downward flow of air, usually nitrogen or other inert gas. However, to ensure suppression of the vortex, the air flow should preferably be highly laminar and have high velocity, which requires extremely uniform exhaust and lots of nitrogen. The air velocity may be 45-90 feet per minute (ft/m), preferably 60-80 ft/m. Protrusions from the wall, such as that for the etching fluid dispensing apparatus, also affect the downward air flow. Also, the distance between the wafer and the wall should be minimized but should allow adequate clearance. The distance between the wafer and the module wall may be 10-20 inches, preferably 14-15 inches. Lastly, the faster the chuck rotates, the more turbulence is created. Although SRD chucks (spin/rinse/dry only) may rotate at about 5000 rpm, at that speed the turbulence and entrainment are too great for the EBR chuck. In general, rotation speeds of about 0-2500 rpm, preferably 100-1500 rpm, and even more preferably 500-1300 rpm, are consistent with the present invention.

The next input is a source of deionized water 436. The deionized water is delivered to chamber 422 under the control of a valve 438 and through a delivery line and nozzle 438. Note that line 438 directs deionized water onto the top of wafer 424. This enables rinsing of the wafer's top side. A preferred nozzle sprays fluid as a thin "fan" that spreads out over the inner three-quarters of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing.

A similar deionized water system provides a stream or fan of deionized water to the backside of wafer 424. This deionized water is provided from a source of deionized water 440, which may be the same as source 436. A valve 442 controls the flow of deionized water onto the backside of wafer 424 via a line and nozzle 444. The nozzle associated with 444 may have the same design criteria as just mentioned for nozzle 438. The goal is to rinse etchant from the backside of wafer 424.

An acid rinse may be conducted on the front side of wafer 424. To this end, a source of sulfuric acid 446 provides sulfuric acid to a delivery line and nozzle 450. Other acids may be used as appropriate or combined with sulfuric acid. For example, hydrogen peroxide may be used. Preferably, this module includes a valve that controls the delivery of sulfuric acid to module 420. The flow of sulfuric acid into chamber 422 may be monitored by a mass flow meter 448. Note that in the depicted embodiment nozzle 450 is oriented to direct sulfuric acid onto the center of the front side of wafer 424. After the acid is delivered to the center of the wafer it then spins out into the edge of the wafer during rotation. This solution is applied to remove residual copper oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 438.

Liquid etchant used to remove copper or other unwanted metal from portions of wafer 424 is provided from a source of liquid etchant 452 as shown. The etchant passes through a mass flow meter 454 and is delivered to wafer 424 via a line and nozzle 456. Preferably, the etchant is delivered precisely to the edge bevel region of wafer 424 to remove PVD copper in that region only.

A second liquid etchant stream may be delivered to the backside of wafer 424 in order to etch off any copper or other unwanted metal that may have been deposited on the backside of wafer 424. As shown, such etchant is delivered from an etchant source 458. Preferably, this is the same source as 452. As shown, etchant from source 458 passes through a mass flow meter 460 and through a nozzle 462, which directs it onto the backside of wafer 424.

Figure 5:
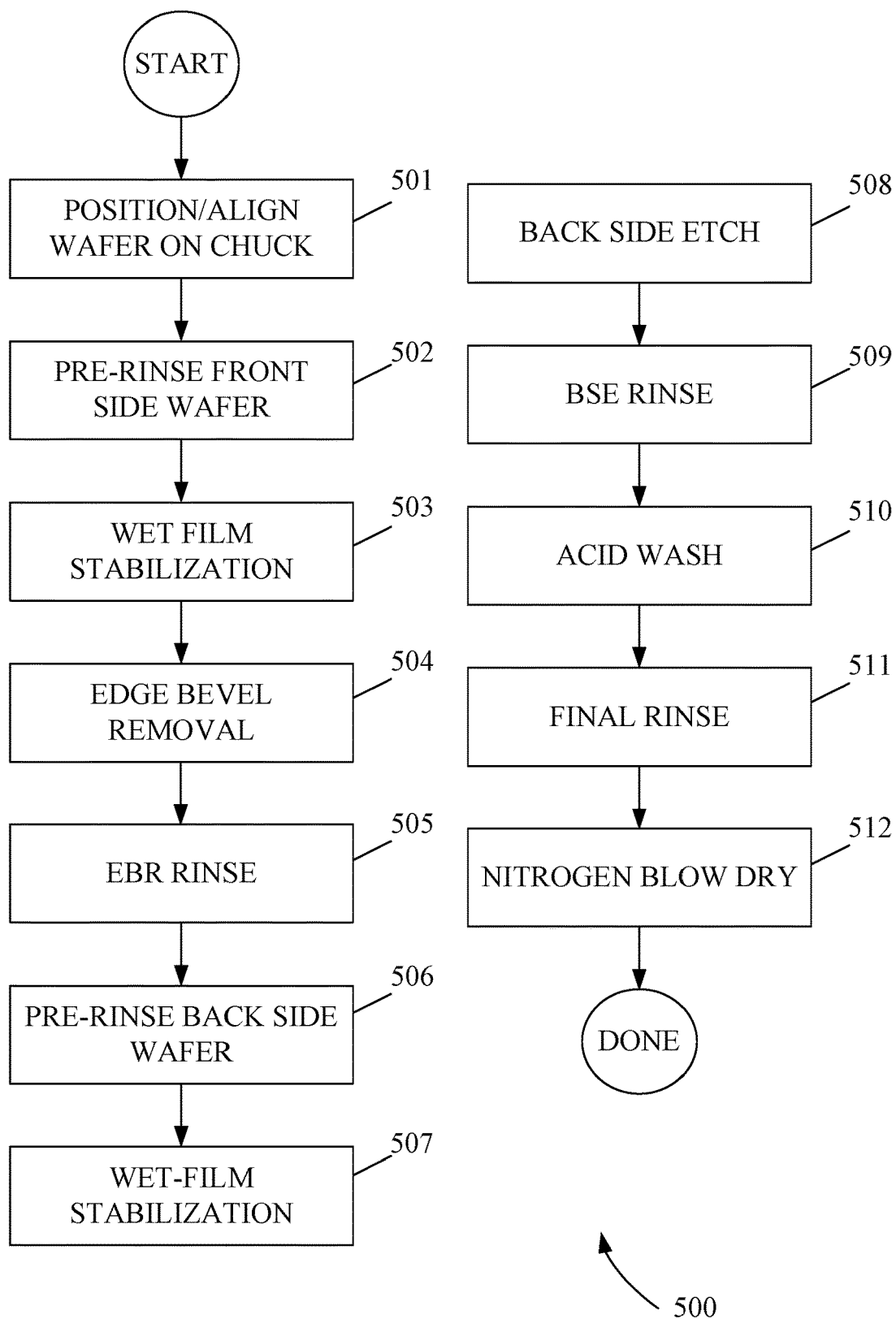
FIG. 5 is a process flow diagram illustrating a typical sequence of operations employed with a post-electrofill module in accordance with an embodiment of this invention.

An example EBR process is illustrated in FIG. 5. The EBR process 500 can be carried out by a post-electrofill module, such as module 420 of FIG. 4, that is specifically designed to carry out the EBR process. The process begins at 501, with a robot arm placing the wafer on the module chuck for EBR processing. The wafer is typically aligned by a number of sloped alignment members and placed on a set of frictional support pins that hold the wafer in place by static friction, even when the wafer is later rotated. After the robot arm retracts, deionized water is applied to the front of the wafer and the wafer is spun at about 200-400 rpm in order to pre-rinse the wafer of any particles and contaminants left over from previous steps 502. The deionized water is then turned off and the wafer is spun up to a speed of between about 350-500 rpm, which creates a uniformly thin layer of deionized water (wet-film stabilization) 503. This wet-film stabilization facilitates an even distribution of the etchant over the front side of the wafer. At this time, at the latest, any alignment pins or clamps that were used to precisely align the wafer in the chuck are retracted from the edge of the wafer.

After wet-film stabilization 503, the core feature of the EBR, actual removal of the edge bevel metal 504 is performed. The EBR etchant is typically applied to the surface of the wafer using a thin nozzle tube, which has a nozzle opening at or near its end. In a specific example, an EBR dispense arm is positioned over the wafer edge. Then EBR is performed under the following conditions: a total of about 3 to 15 milliliters etchant is delivered at a rate of about 0.2 to 3 milliliters/second (more preferably about 0.3 to 0.4 milliliters/second) for a 300 millimeter wafer. In some embodiments, the etchant may be dispensed in two or more operations of different flow rates. In a particular example, the 1 ml of the etchant is dispensed at 0.4 ml/sec for a first operation, then 10 ml of the etchant is dispensed at 0.3 ml/sec for a second operation.

During EBR, some etchant may flow onto the backside of the wafer and etch it. An alternative embodiment for practicing the present invention is to have the wafer facing upside down, and to apply the etchant to the backside edge.

After the required amount of liquid etchant has been applied to the edge of the wafer, deionized water is again applied to the front side of the wafer as a post-EBR rinse 505. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time as commencement of step 505, the backside of the wafer is pre-rinsed 506 with deionized water, which is wet-film stabilized 507 in much the same manner that the front side of the wafer was (e.g., the wafer rotation speed is held at about 350 to 500 rpm). After the flow of deionized water to the wafer backside ends, a backside etch operation 508 is performed—generally with the same etchant that was used for the EBR. In a specific embodiment, a thin jet (initially 0.02 to 0.04 inches in diameter) of liquid etchant is aimed at the center of the wafer backside. The etchant is delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.

The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically takes 1-4 seconds and uses 1 to 5 cubic centimeters of the etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water to rinse any liquid etchant, particles and contaminants remaining from the BSE 509. Then the flow of deionized water to the front side ends and about 2 to 4 milliliters of a dilute acid, generally less than about 15% by weight acid, is applied to the front side of the wafer to remove residual metal oxide and remove the associated discoloration 511. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15-30 seconds at about 300-400 milliliters/min. Finally the wafer can be spun and blow-dried, as desired, on both sides with nitrogen 512. Generally, any drying step is carried out at about 750-2000 rpm for about 10 to 60 seconds, and necessitates a clamping for the wafer once it reaches about 750 rpm. After this processing in the PEM is completed, a robot arm picks up the wafer and puts it in a cassette.

The Wafer Chuck

As discussed above, the wafer chuck design must ensure that the EBR etchant flows in a steady viscous stream thereby etching the wafer at constant radii. Uneven or non-uniform edge exclusion would result in less of the wafer being useable for active circuit. Additionally, turbulence induced by the high-speed rotation is believed to entrain droplets from the module chamber wall. The turbulence is a function of chuck speed, which is much higher for 300 mm because the wafer holder is further away. These droplets may be sprayed back onto the clean wafer surface and produce measurable contamination and cause a particle excursion. Such failure mode must be alleviated before the module may be used because particles can cause defects and reduce yield.

Figure 6A:
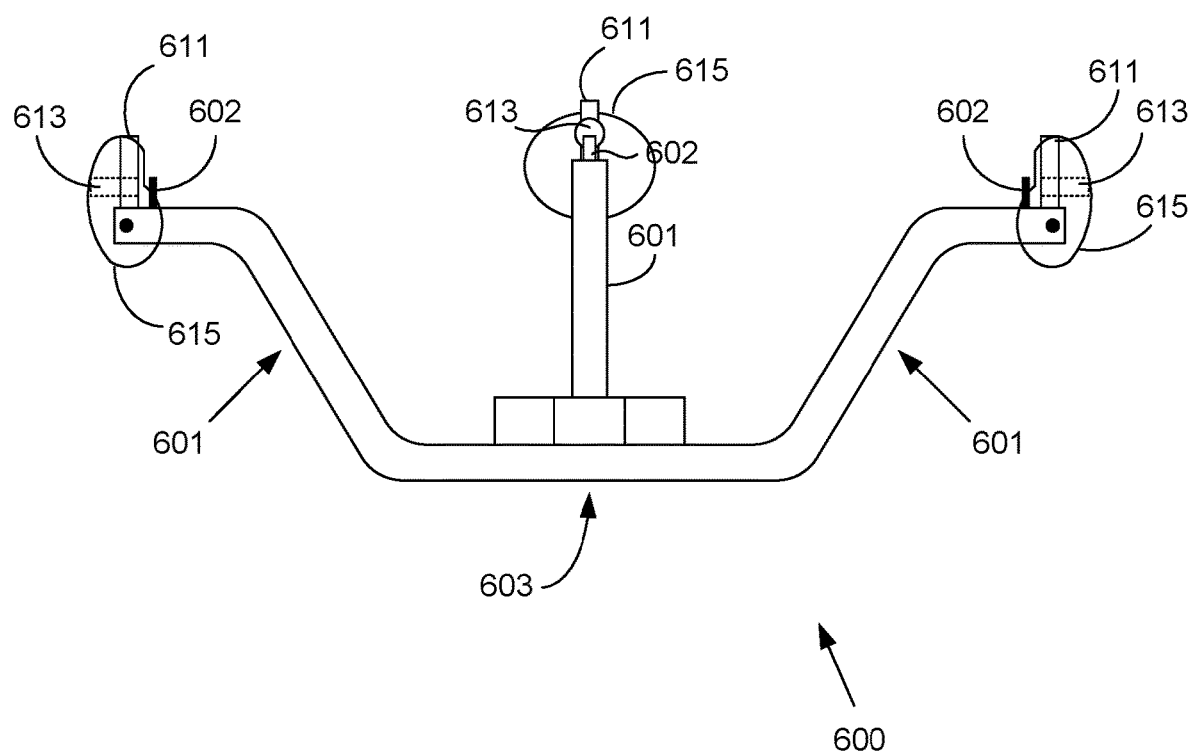
FIG. 6A is a schematic illustration of a simplified wafer chuck with two chuck arms and no alignment and clamping members.
Figure 6B:
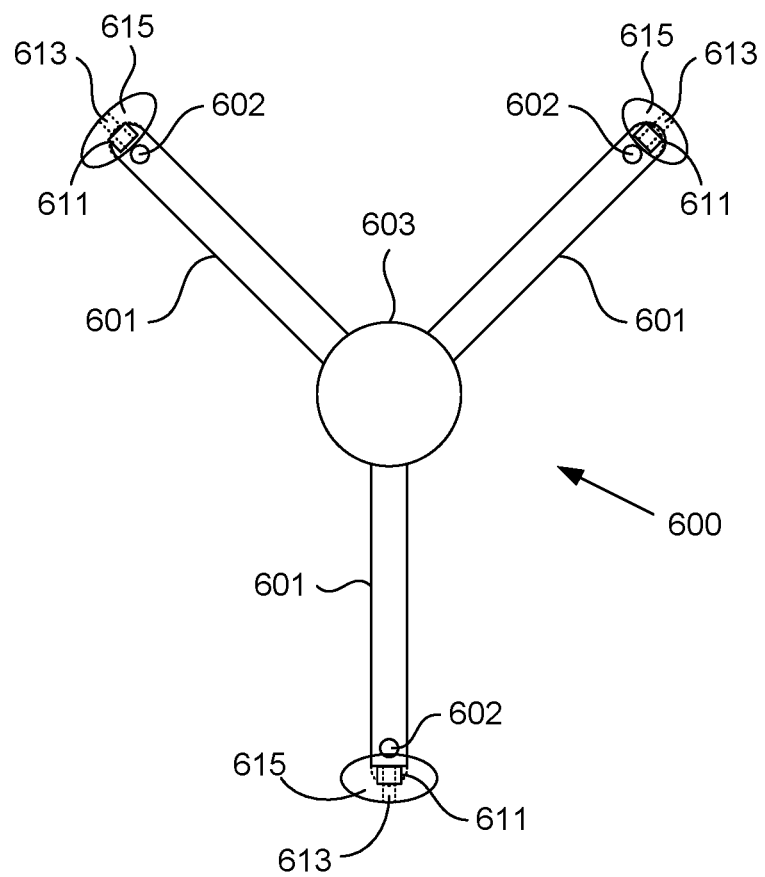
FIG. 6B is a top-view schematic illustration of a wafer chuck with three chuck arms, each with an alignment/clamping member at the end.

FIG. 6A is a highly simplified side-view of portions of a wafer chuck 600 that is used to support and rotate a wafer in a PEM. FIG. 6B is a highly simplified top view of the wafer chuck 600. Wafer chuck 600 is shown with three chuck arms 601. The arms may be evenly spaced around the center of the chuck. At the end of each arm 601 is a wafer holder which includes an alignment member 611 and a clamping member 615. The alignment members 611 are used to facilitate proper alignment of the wafer on chuck 500 as the wafer is delivered to chuck 600. Each chuck arm 601 has a support pin 602 that impinges on the bottom of the wafer (wafer not shown).

The wafer chuck 600 and the wafer rotate about a center of rotation in a base 603. Wafer chucks are also outfitted with clamping members 615 that hold the wafer in position during high rotation rates. Note that the alignment members 611 and clamping members may have a through hole 613, which allows etchant and other liquids delivered onto the wafer to flow off the wafer and beyond the chuck, without becoming entrained on the alignment members or other elements of the chuck. Note also that while FIGS. 6A and 6B are shown with only three chuck arms, other embodiments may employ more arms. In one specific embodiment, a wafer chuck of this invention includes six arms, three that have alignment members and another three that have clamping members.

As discussed above, vortex turbulence caused by the wafer holder rotating is believed to entrain sidewall droplets and creates particles. The turbulence also affects the etchant stream from the EBR, which makes the edge exclusion uneven. This effect is shown by the reduction of edge exclusion variation at low rotational speeds and high levels of variation at high rotational speeds. One way to reduce the turbulence is to reduce the drag of the moving object. Drag may be affected by the velocity, frontal area, angle of inclination, and the shape of the object, among others. The shape of the object determines a drag coefficient, which is usually determined experimentally. Aerodynamic shaping is known to reduce drag caused by the shape of the object. FIG. 7 shows known drag coefficients (Cd), or form drag, for a number of shapes. Empirical Cd are measured in calibrated wind tunnels for various shapes. Cd's for various shapes may be found in many reference materials such as *Fluid Dynamic Drag* by Sighard Hoerner, which is herein incorporated by reference for all purposes. For example, the drag coefficient for a spherical cap is 0.38 (701); for a hemisphere, 0.42 (703), for bean shape, 0.59 (7/5); for a diamond, 0.8 (707); and for an equilateral triangle, 0.5 (709) (Sighard Hoerner, *Fluid Dynamic Drag*, pp. 3-17). A wafer holder having these shapes would have lower drag coefficients (less than 0.8) than one with a flat face facing the direction of air flow (greater than 1.0). The present invention may employ any one or more of these shapes in the wafer holders for aerodynamic drag reduction.

Further streamlining the shape and adding an aerodynamic rear end may reduce the drag coefficient to as low as 0.2 or below. The drag coefficient must be balanced with the length of the structure, because while longer structures may have less drag, such structures increase the weight of the wafer chuck, affecting the rotation mechanism. They also increase the amount of the wafer perimeter covered by the structures, which as described above, should remain relatively uncovered so that etchant and DI water may flow unimpeded. In certain embodiments, less than 25% of the wafer perimeter may be covered by the structures; preferably less than 10% of the wafer perimeter may be covered.

The overall angle of the turbulence reducing structure may be about 30-90 degrees, preferably 30-60 degrees. The overall angle is the apex angle of a triangle containing the turbulence reducing structure with the apex pointing in the forward direction of rotation and the base perpendicular to the wafer. Preferably, a line of the wafer in the horizontal plane would bisect the triangle. This triangle is shown in dotted lines on FIG. 8A as 823 with apex angle 825. The overall angle affects the drag coefficient and length of the turbulence reducing structure. A smaller overall angle means longer structure with lower drag. A bigger overall angle means shorter structure with bigger drag.

Figure 8A:
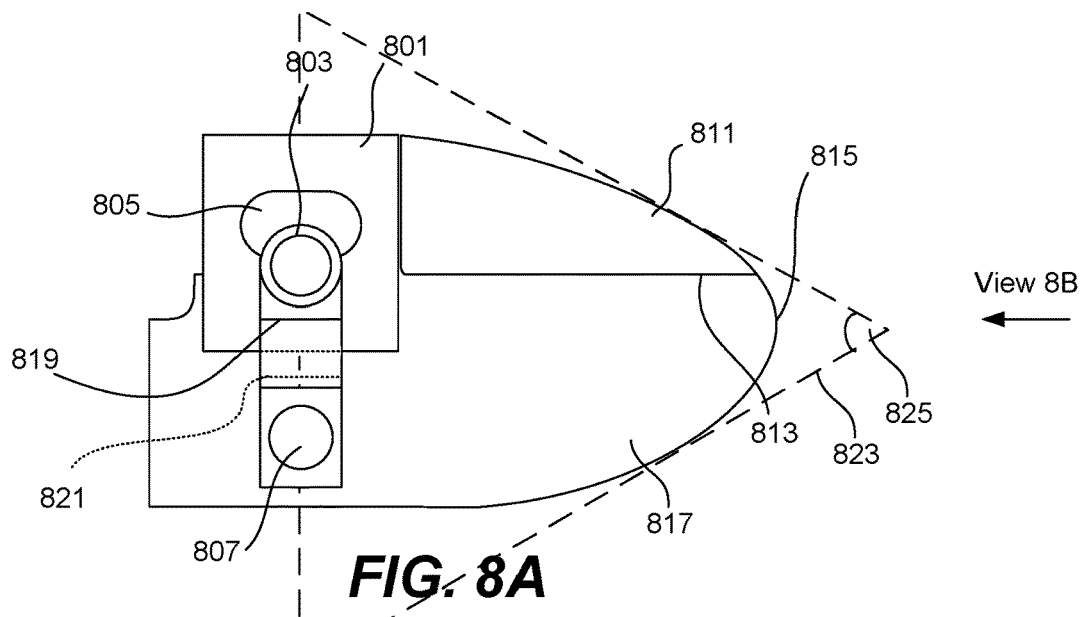
FIG. 8A shows a schematic illustration of a wafer holder as viewed from the center of the chuck looking outward toward the region of the wafer perimeter in accordance with the present invention.

FIGS. 8A-11C shows schematic designs for wafer holders that have reduced drag coefficients. FIG. 8A shows the wafer holder as viewed from the center of the chuck looking outward toward the region of the wafer perimeter, with the air flow from right to left in consideration of a clockwise rotation. View 8B shows a horizontal view of the front of the wafer holder. A rotating wafer holder, rotating clockwise, would be moving toward the viewer. Although clockwise rotation is illustrated here as an example, the present invention is not limited to a clockwise rotation. For example, suitable wafer holders that have reduced drag coefficients may be designed for a chuck that rotates counter-clockwise, or in both directions.

Figure 8B:
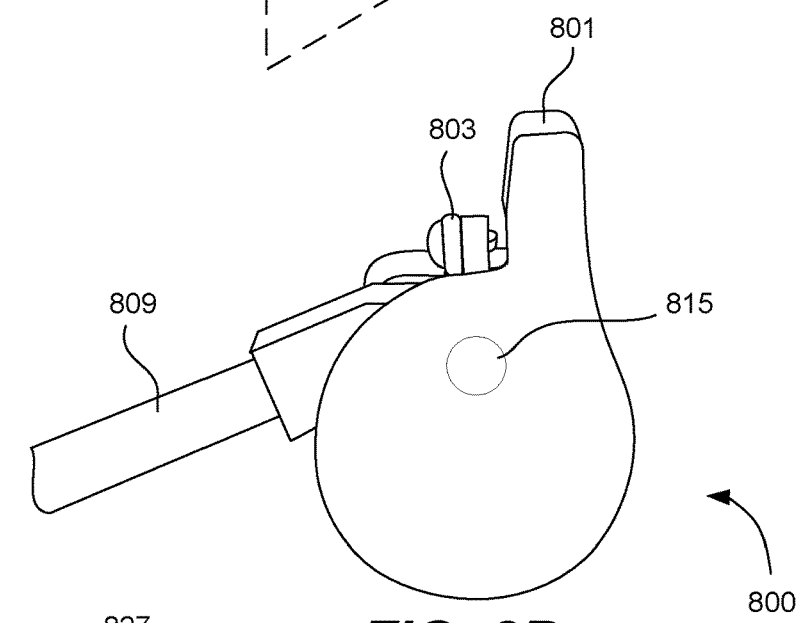
FIG. 8B shows a schematic illustration of the wafer holder of FIG. 8A in accordance with the present invention.

FIG. 8B shows a wafer holder 800 attached to the end of wafer chuck arm 809 at point 807. The wafer may be placed on top of support pins 803, which holders the wafer in place by friction during low rotation. The alignment member 801 is tapered to align the wafer as it is placed into the wafer chuck. The alignment pin has a through hole 805, which allows the liquid applied to the wafer to drain through the wafer holder. The clamping member 817, as shown, is the aerodynamically shaped turbulence reducing structure.

Figure 8C:
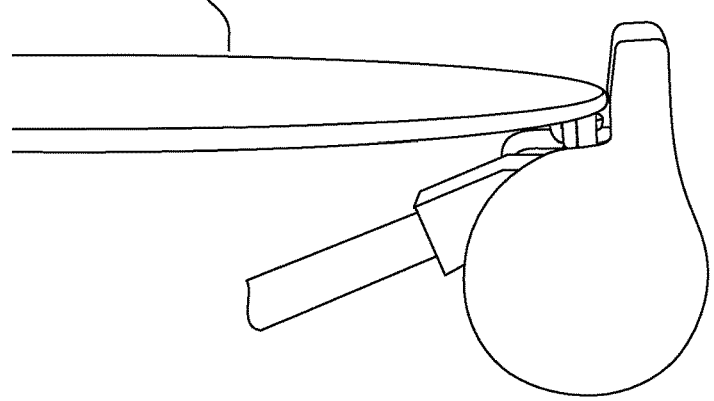
FIG. 8C shows a schematic illustration of the wafer holder of FIG. 8A in accordance with the present invention.

The shape of the turbulence reducing structure 817 may be paraboloid having a portion of a quadrant removed. The removed portion gives room for the wafer to be positioned on top of the supports 803. FIG. 8C shows a view of the wafer holder with a wafer 827 on top of the supports 803. The wafer clearance between the bottom of the wafer and the top of the shelf 813 may be about 0.1-0.5 inch, preferably about 0.3 inch. The clearance is required to form an escape path for the liquid applied to the wafer. Without adequate clearance, liquid may accumulate around the shelf. Preferably, the etchant flows down the edge of the wafer and to the backside unimpeded. Optionally, the structure may include holes at areas above the shelf at element 811 to allow liquid to escape, performing the same function as hole 805. The tip of the structure is shown at the location of arrow 815. In general, the tip may be a point or may be smooth. Although a pointed tip may be slightly better for drag, a rounded tip may be preferred because it is safer to handle and a pointed tip may be more fragile.

During operation, the alignment member 801 and the clamping member 817 rotate in opposite direction at different rotational speeds. At no rotation or low rotational speeds, the alignment member 801 stays in the alignment position, ensuring a centered wafer. In this position, the alignment member contacts the edge of wafer when the wafer is placed on the chuck. More specifically, the chuck arms and their associated alignment members are positioned so that they contact a wafer being placed on the chuck in a manner that causes the wafer to precisely slide into correct alignment on the wafer chuck. The alignment member 801 in FIGS. 8A and 8*b* is shown in its inner, alignment position. As the speed increases, the alignment member 801, having a center of gravity higher than a pivot pin 819, pivots outward from the wafer due to the centripetal force at a particular rotational speed. After the alignment member pivots away, the wafer may be etched because the alignment member 801 no longer contacts the wafer and impedes etchant flow. After the EBR and BSE processes, the rotational speed is increased further for the rinsing and drying steps. As the rotational speed increases further, the clamping member 817 pivots inward toward the wafer, holding the wafer in position during high-speed rotation such as that used during drying. In some embodiments, the clamping member has a notch that holds the wafer. The clamping member 817 has a center of gravity lower than that of its pivot pin 821. The clamping force increases with the centripetal force, which is directly correlated to the rotational speed. One skilled in the art would be able to design a wafer holder that would align, release the wafer edge, and clamp the wafer at various desired rotational speeds.

Figure 9A:
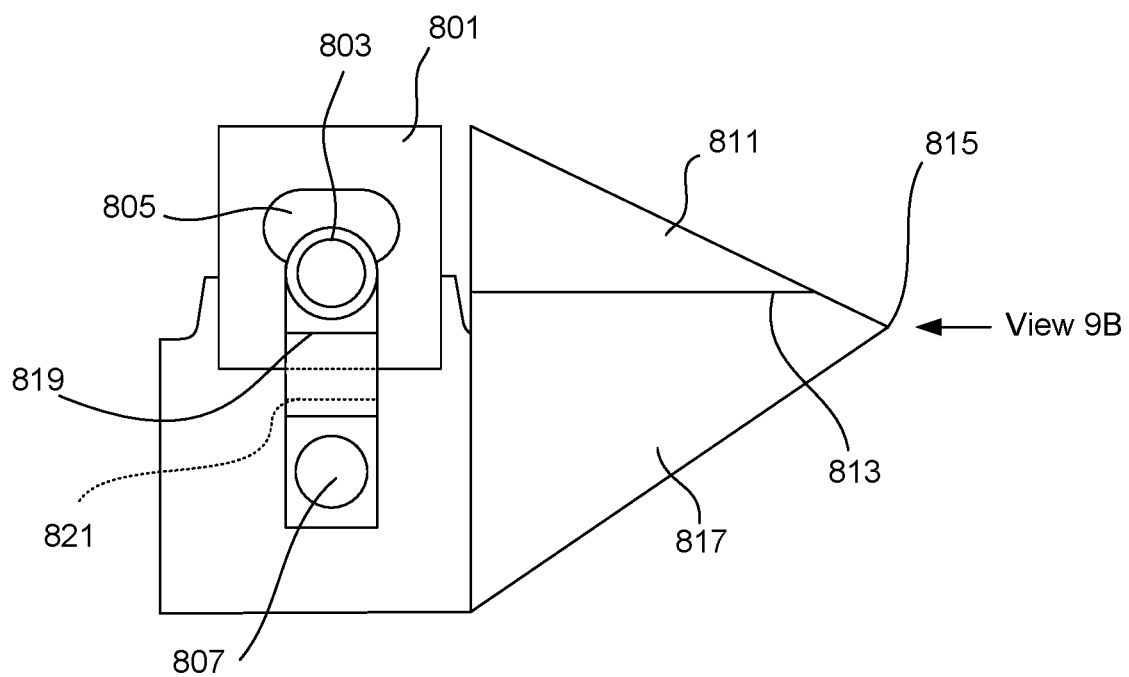
FIG. 9A shows a schematic illustration of a turbulence reducing structure having a pointed end in the same of a pyramid having a portion removed in accordance with the present invention.
Figure 9B:
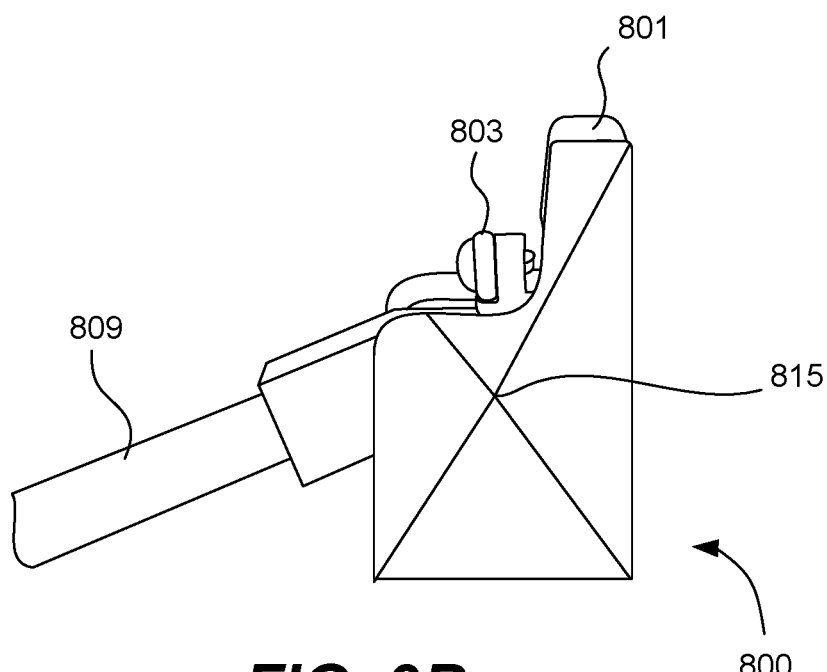
FIG. 9B shows a side view of the turbulence reducing structure of FIG. 9A.

FIGS. 9A to 11C shows various other aerodynamic shape types that may be used with the present invention. FIG. 9A shows a turbulence reducing structure having a pointed end 815 in the shape of a pyramid having a portion removed. As examples, the turbulence reducing structure may be based on a paraboloid, a cone, or a prismatoid having three or more sides, all with a portion removed, as necessary, to make room for the wafer and clearance. A prismatoid is a polyhedron where all the vertices lie in one of two parallel planes. For example, a pyramid such as that of FIG. 9A has one vertex in one plane and 4 vertices in another plane. A wedge is also a prismatoid having two vertices in one plane and four in another. FIG. 9B is a view of the turbulence reducing structure from the pointed end 815.

Figure 10A:
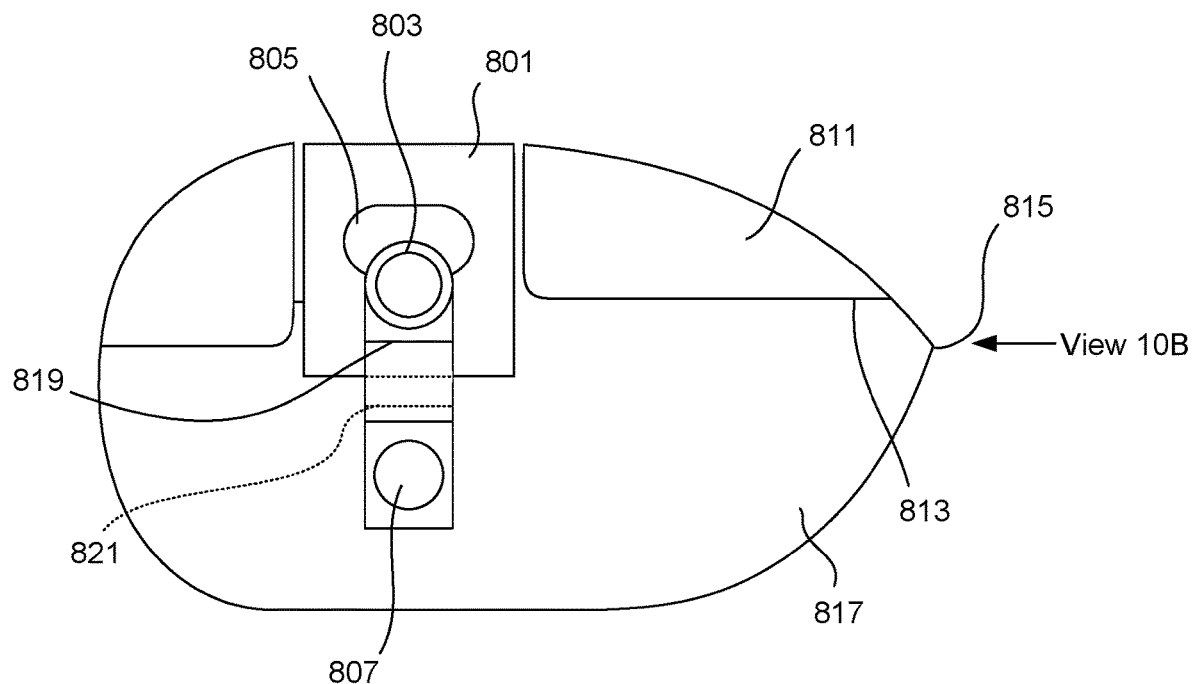
FIG. 10A shows a schematic illustration of a turbulence reducing structure having two ends of different shapes in accordance with the present invention.
Figure 10B:
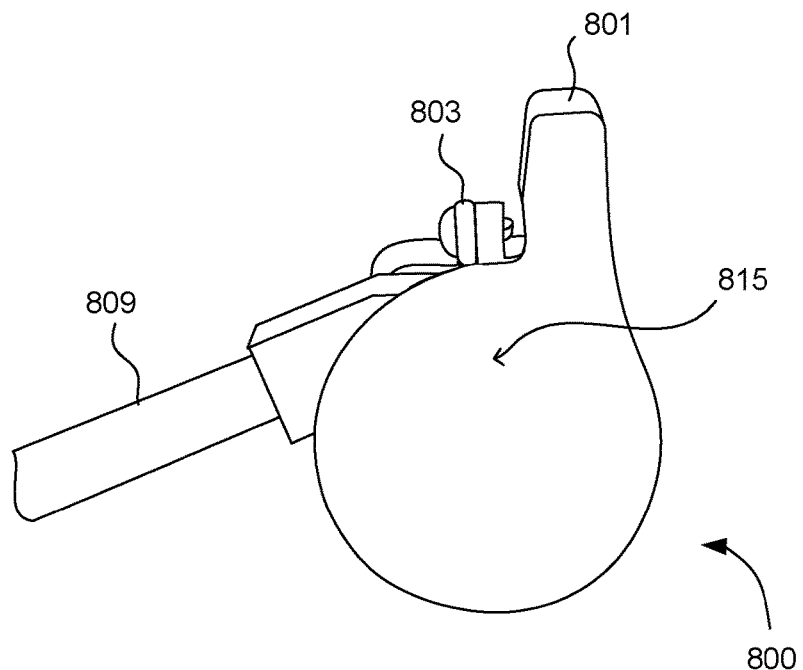
FIG. 10B shows a side view of the turbulence reducing structure of FIG. 10A in accordance with the present invention.
Figure 11A:
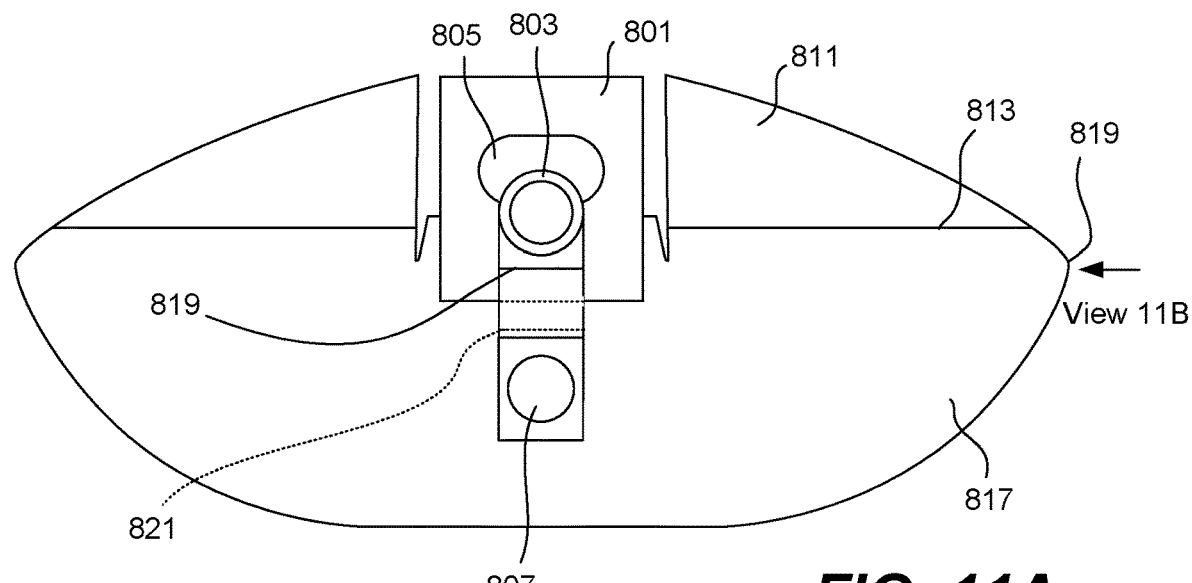
FIG. 11A is a view of a schematic illustration of a turbulence reducing structure as viewed from the wafer in accordance with the present invention.
Figure 11B:
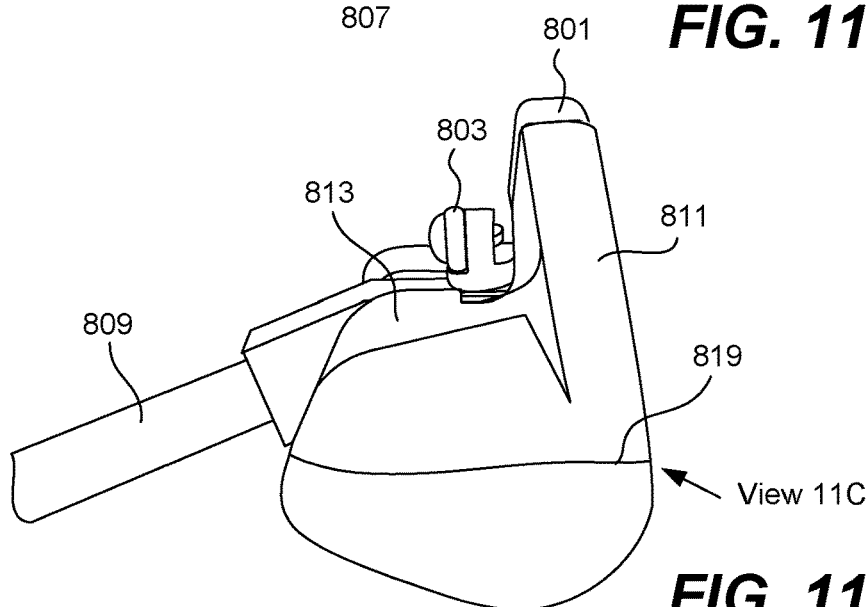
FIG. 11B is a side view of a schematic illustration of the turbulence reducing structure of FIG. 11A in accordance with the present invention.
Figure 11C:
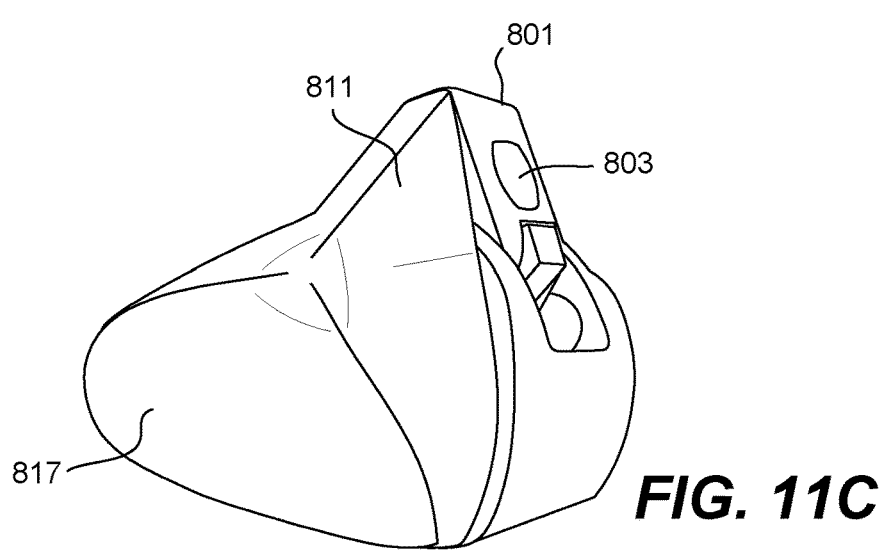
FIG. 11C is a perspective view of the turbulence reducing structure of FIG. 11A in accordance with the present invention.

The clamping member may have turbulence reducing structures on both ends, not just the forward end. FIG. 10A shows an embodiment where the two ends are of different shapes. FIGS. 11A-11C shows an embodiment where the two ends are of the same shape. In FIG. 10A, the forward end has a pointed tip and the rear end has a round tip. Various other combinations are possible. For example, a teardrop shape with a rounded forward end and long pointed rear end may have a suitable drag coefficient. FIG. 10B is a view of the turbulence reducing structure of FIG. 10A from the pointed end 815. FIGS. 11A-11C shows an example of the "shark fin and snout" shape type. The structure has an irregular shape having curved faces and lines. The turbulence reducing structure of FIGS. 11A-11C may be described as a wedge or a tetrahedron having curved faces with a portion removed. As viewed from the wafer, the structure has a curved top and bottom that comes to a rounded point (FIG. 11A), with the top resembling a shark fin. As view from the front (FIG. 11B), the structure resembles a shark snout, again with a portion removed. FIG. 11C shows the same structure in a perspective view.

The present invention is not limited to the embodiments described. As discussed above, any aerodynamic shape having a drag coefficient of 0.5 and below, or preferably around 0.2 to 0.3 may be used.

The structure should preferably substantially shield the alignment pin from direct airflow while the chuck is spinning. The height of top of the structure should be about the top of the alignment member in the engaged position. The structure should also avoid imparting a vertical momentum on the wafer chuck. In other words, the pressure above and below the structure should be balanced; e.g., the drag of the flow above and below the structure should be about the same. The wafer chuck should not move vertically while the wafer chuck start to spin or speed up.

Further, the structure preferably has little or no airflow displacement in the horizontal direction, because radial airflow may affect the EBR etchant stream. In other words, the structure should move more air to its top or bottom instead of its sides. A substantial airflow to the sides of the structure may create air currents that can affect the EBR etchant stream. To minimize the horizontal airflow, the structure should preferably have less surface areas toward and away from the wafer then the surface areas above and below the wafer. Less surface areas toward and away from the wafer means that less air would be directed horizontally from the wafer, which may affect the EBR etchant flow as the structure spins past the stream.

As discussed above, the clamping member rotates 817 to engage the wafer during high-speed rotation. It is envisioned that this rotation would be small, around 10-45 degrees, preferably around 20 degrees so as to impart only a very small radial air displacement. At lower speeds, the structure should not impart any radial displacement so as to minimize effect on the EBR etchant stream. At higher speeds when the clamp engages the wafer, a small radial air displacement may be tolerated because in that regime, the EBR etchant is not flowing.

While this invention has been described in terms of a few preferred embodiments, it should not be limited to the specifics presented above. Many variations on the above-described embodiments may be employed. Note, for example, that other semiconductor processes may also uses a rotating wafer chuck that has the same particle and radial precision concerns. For example, in CMP, the wafer is also cleaned, rinsed, and dried. The ability to rotate the wafer at very high speeds without causing air turbulence in the chamber may be desirable in many applications. Therefore, the invention should be broadly interpreted with reference to the following claims.

What is claimed is:

1. A method of processing a semiconductor wafer in a wafer chuck, the method comprising:
 a. providing the semiconductor wafer to the wafer chuck having chuck arms and a plurality of wafer holders at ends of the chuck arms; and
 b. rotating the wafer chuck thereby rotating the semiconductor wafer; and
 wherein each of the wafer holders comprises a turbulence reducing structure comprising a curved or angled aerodynamically shaped surface, and
 wherein the turbulence reducing structure is oriented and configured such that, when rotating during post-electrofill wafer processing using a stream of fluid on at least a portion of the semiconductor wafer facing the turbulence reducing structure, the wafer holders do not substantially affect the stream of fluid and thereby reduces process variations on the semiconductor wafer.

2. The method of claim 1, further comprising:
 a. etching metal from the semiconductor wafer while it rotates.

3. The method of claim 1, further comprising:
 a. cleaning the semiconductor wafer while it rotates; and
 b. drying the semiconductor wafer while it rotates.

4. The method of claim 1, further comprising:
 a. aligning the semiconductor wafer; and
 b. clamping the semiconductor wafer while it rotates at a high speed.

5. The method of claim 1, wherein the plurality of wafer holders cover less than 25% of wafer perimeter when holding the semiconductor wafer.

6. The method of claim 1, wherein the wafer chuck is rotated at a speed sufficient to pivot an alignment member each of the plurality of wafer holders outward relative to a center of the wafer chuck to expose an edge of the semiconductor wafer.

7. The method of claim 1, further comprising providing the stream of fluid to the semiconductor wafer to etch or clean the semiconductor wafer.

8. A method of processing a wafer in a wafer chuck, the method comprising:
 providing the wafer to the wafer chuck having a plurality of chuck arms and a plurality of wafer holders at ends of the plurality of chuck arms to hold the wafer, each of the plurality of wafer holders comprising a forward end and a rear end along a direction of rotation of the wafer chuck, and a turbulence reducing structure on the forward end, the rear end, or both ends of each wafer holder;

rotating the wafer chuck in the direction of rotation to thereby rotate the wafer; and providing a stream of fluid to the wafer to etch or clean the wafer, wherein the wafer holders do not substantially affect the stream of fluid to the wafer and thereby reduces process variations on the wafer, and wherein the turbulence reducing structure comprises a curved or angled aerodynamically shaped surface and is oriented and configured such that, when rotating during post-electrofill wafer processing using stream of fluid on at least a portion of the wafer facing the turbulence reducing structure, the wafer holders do not substantially affect the stream of fluid.

9. The method of claim 8, wherein the stream of fluid comprises etchant to etch metal from the wafer while it rotates.

10. The method of claim 8, wherein the stream of fluid comprises deionized water to clean the wafer while it rotates.

11. The method of claim 10, further comprising after providing the stream of fluid, drying the wafer while it rotates.

12. The method of claim 8, further comprising aligning the wafer; and clamping the wafer while it rotates at a speed between 750 rpm and 2000 rpm.

13. The method of claim 8, wherein the stream of fluid flows down an edge of the wafer and to a backside of the wafer unimpeded.

14. The method of claim 8, wherein less than 25% of wafer perimeter is covered by the plurality of wafer holders.

15. The method of claim 8, wherein the wafer chuck is rotated at a speed sufficient to pivot an alignment member of each of the plurality of wafer holders outward relative to a center of the wafer chuck to expose an edge of the wafer.

\* \* \* \* \*